United States Patent [19]

Lue et al.

[11] Patent Number: 5,761,023
[45] Date of Patent: Jun. 2, 1998

[54] SUBSTRATE SUPPORT WITH PRESSURE ZONES HAVING REDUCED CONTACT AREA AND TEMPERATURE FEEDBACK

[75] Inventors: Brian Lue, Mountain View; Tetsuya Ishikawa, Santa Clara; Fred C. Redeker, Fremont; Manus Wong; Shijian Li, both of San Jose, all of Calif.

[73] Assignee: Applied Materials, Inc., Santa Clara, Calif.

[21] Appl. No.: 641,147

[22] Filed: Apr. 25, 1996

[51] Int. Cl.⁶ .................................................... H02N 13/00
[52] U.S. Cl. ....................................... 361/234; 361/233
[58] Field of Search ................................ 361/233, 234; 279/128

[56] References Cited

U.S. PATENT DOCUMENTS

| | | | |
|---|---|---|---|
| 4,412,133 | 10/1983 | Eckes et al. | 250/492.2 |
| 4,480,284 | 10/1984 | Tojo et al. | 361/234 |
| 4,502,094 | 2/1985 | Lewin et al. | 361/234 |
| 4,521,995 | 6/1985 | Sekiya | 51/235 |
| 4,665,463 | 5/1987 | Ward et al. | 361/234 |
| 4,692,836 | 9/1987 | Suzuki | 361/234 |
| 4,832,781 | 5/1989 | Mears | 156/345 |
| 4,934,670 | 6/1990 | Witte | 269/8 |
| 5,096,536 | 3/1992 | Cathey, Jr. | 156/643 |
| 5,104,834 | 4/1992 | Watanabe et al. | 501/127 |
| 5,151,845 | 9/1992 | Watanabe et al. | 361/234 |
| 5,160,152 | 11/1992 | Toraguchi et al. | 279/128 |
| 5,191,506 | 3/1993 | Logan et al. | 361/234 |

(List continued on next page.)

FOREIGN PATENT DOCUMENTS

| | | | |
|---|---|---|---|
| 0452222 A1 | 10/1991 | European Pat. Off. | H02N 13/00 |
| 0486966 A1 | 11/1991 | European Pat. Off. | H02N 13/00 |
| 1-251735 (A) | 6/1989 | Japan | |

OTHER PUBLICATIONS

Electrostatic Wafer Holding For Wafer Cooling During Reactive Ion Etching, IBM Technical Disclosure Bulletin, vol. 31, No. 1, Jun. 1988.

Article entitled, "Effect of Additives on the Electrostatic Force of Alumina Electrostatic Chucks", Watanabe et al., Journal of the Ceramic Society of Japan 100 [1] 1992.

Article entitled, "Relationship between Electrical Resistivity and Electrostatic Force of Alumina Electrostatic Chuck", Watanabe et al., Jpn. J. Appl. Phys. vol. 32 (1993) Pt. 1, No. 2.

Article entitled, "Low voltage and high speed operating electrostatic wafer chuck using sputtered tantalum oxide membrane", Nakasuji et al., J. Vac. Sci. Technol. A 12(5), Sep./Oct. 1994.

Article entitled, "Resistivity and Microstructure of Alumina Ceramics Added with $TiO_2$ Fired in Reducing Atmosphere", Watanabe et al., Journal of the Ceramic Society of Japan, Int. Edition, vol. 101-1077, 1993.

(List continued on next page.)

*Primary Examiner*—Fritz Fleming
*Attorney, Agent, or Firm*—Townsend and Townsend and Crew LLP

[57] ABSTRACT

An improved substrate support and method for operating in which multiple pressure zones are provided on the surface of the substrate support. A seal area is provided between the different zones to allow different gas pressures in the two zones. A higher gas pressure is provided to a zone corresponding to an area of the substrate where greater heat transfer is desired. The gap between the substrate support and the gas pressure are selected to provide the desired amount of heat transfer. Another aspect is limited substrate contact using protrusions, to maximize heat transfer gas flow. A closed loop control system varies the heat transfer gas pressure in accordance with a temperature sensor. For an electrostatic chuck, the dielectric thickness is varied to give a higher electrostatic force at the periphery of the substrate.

43 Claims, 5 Drawing Sheets

U.S. PATENT DOCUMENTS

| | | | |
|---|---|---|---|
| 5,207,437 | 5/1993 | Barnes et al. | 279/128 |
| 5,270,266 | 12/1993 | Hirano et al. | 437/228 |
| 5,350,479 | 9/1994 | Collins et al. | 156/345 |
| 5,382,311 | 1/1995 | Ishikawa et al. | 156/345 |
| 5,382,469 | 1/1995 | Kubota et al. | 428/332 |
| 5,530,616 | 6/1996 | Kitabayashi et al. | 361/234 |
| 5,535,507 | 7/1996 | Barnes et al. | 361/234 |
| 5,548,470 | 8/1996 | Husain et al. | 361/234 |
| 5,581,874 | 12/1996 | Aoki et al. | 361/234 |
| 5,609,720 | 3/1997 | Lenz et al. | 156/643.1 |

OTHER PUBLICATIONS

Article entitled, "Electrostatic Force and Absorption Current of Alumina Electrostatic Chuck", Watanabe et al., Jpn. J. Appl. Phys. vol. 31 (1992) pp. 2145–2150, Part 1, No. 7, Jul. 1992.

Article entitled, "Low voltage and high speed operating electrostatic chuck", Nakasuji et al., J. Vac. Sci. Technol. A, vol. 10, No. 6, Nov./Dec. 1992.

SUBSTRATE SUPPORT WITH PRESSURE ZONES HAVING REDUCED CONTACT AREA AND TEMPERATURE FEEDBACK

BACKGROUND OF THE INVENTION

The present invention is directed to substrate supports, and in particular to mechanisms for achieving uniform temperature distribution within a substrate.

Processing chambers for substrates often include a substrate support, such as a pedestal, for positioning the substrate in the chamber. The substrate could be a semiconductor wafer, a liquid crystal display, a plate of glass, a mirror, etc. The substrate support can be used to heat or cool the substrate. The process used in the chamber can be any desired process such as a chemical vapor deposition (CVD) or a plasma enhanced CVD (PECVD) process, for example. For a PECVD process, an RF field is applied between an electrode in the substrate support and the top of the chamber. A ceramic material may be applied to the top of the support to provide a dielectric to protect the substrate support electrode in a plasma process, or as part of an electrostatic chuck.

An electrostatic chuck is one type of apparatus for holding a wafer in place while it is being processed. Other methods include a vacuum applied to the bottom side of the wafer, or clamps for holding the wafer down. Clamps provide a non-uniform force and cover the edges of the wafer, while a vacuum applied to the bottom of the wafer is not as effective to hold the wafer in place when used in a chamber in which a vacuum is applied to the interior of the chamber, including the upper side of the wafer.

Electrostatic chucks are devices which have gained wide usage in the semiconductor industry for clamping semiconductor wafers during manufacturing processes, such as high density plasma reactions. Electrostatic chucks employ an electrostatic force between oppositely charged surfaces to secure the wafer to the chuck. Fabrication of some electrostatic chucks involves machining a process compatible metal, such as aluminum, into a suitable support pedestal and grit blasting the top surface of the pedestal. A layer of dielectric material, such as ceramic, is then plasma sprayed onto the upper surface of the pedestal and ground to a smooth, planar upper surface for supporting the wafer. Alternately, a polymer film, such as Kapton™, available from many well-known suppliers, may be used for the dielectric. During chemical processing of the substrate, the chuck functions by applying a high DC voltage between the chamber walls and the metal pedestal, causing positive charge on one side of the dielectric layer and negative charge on the other side. This charge generates an attractive, substantially uniform, coulomb force therebetween that secures the wafer to the dielectric layer. Alternately, multiple electrodes may be formed in the pedestal.

One important process parameter in substrate processing chambers is the temperature of the wafer. During processing, heat is often transferred to or from the substrate via surface conduction and/or convection between the substrate and the underlying substrate support or through an intervening backside gas. The temperature of the substrate support is typically regulated by circulating heat exchanging fluid, such as water or gas, through channels within the substrate support. Alternately, resistive coils can be used to heat the substrate support. The substrate support can thus be used for heating or cooling the substrate. The efficiency of this method, however, is generally limited by the extent to which the backside of the substrate actually contacts the upper surface of the substrate support since, at the microscopic level, only small areas of the two surfaces actually contact each other. To facilitate heat transfer between the substrate and the substrate support, the regions between the contact points are typically filled with gas molecules, such as helium, argon, oxygen, or $CF_4$ to enhance the thermal transfer between the substrate and the substrate support.

One mechanical problem with holding a wafer to an electrostatic chuck is the presence of wafers which are somewhat warped or flexed, rather than flat. U.S. Pat. No. 4,692,836 shows a chuck which can effectively hold a wafer which is bowed up so that there is a gap between the center of the wafer and the chuck. This patent shows varying the thickness of the dielectric coating so that it is thinner near the middle of the electrostatic chuck, and thus a larger charge will develop in the middle to apply a stronger force to the bowed, center of the wafer.

European Published Application No. 0.452.222 shows a two-electrode design for an electrostatic chuck with an outer electrode in a ring shape. In this application, the width of the outer ring electrode is made narrow so that its surface area is smaller to have more charge per area and thus provide a stronger force at the periphery of the chuck. This improves the heat transfer at the periphery of the electrostatic chuck.

Other methods have been used to vary the heat transfer to or from different areas of a wafer. U.S. Pat. No. 4,502,094 enhances the thermal conductivity by having thermally conductive portions protrude from the susceptor beyond a dielectric layer on the susceptor. In particular, copper pillars are used to provide direct contact with the wafer and draw heat more rapidly. The thermally conductive protrusions are also electrically conductive. Another advantage of this design is that any small particles of debris which may be present on the chuck tend to be attracted onto the dielectric in the gaps between the pillars. Such a chuck is apparently useful in non-plasma reactors. In a plasma reactor, a dielectric is needed to prevent shorts between a plasma electrode and the electrode in the electrostatic chuck, thus requiring the electrostatic chuck electrode to be covered with a dielectric. U.S. Pat. No. 5,160,152 also discusses an approach using protrusions extending above the electrostatic chuck's surface. The '152 patent distinguishes itself from a structure providing a gas underneath the wafer, discussed below. Rather, projections are provided on the top of the electrostatic chuck. This patent addresses wafers that get hotter in the middle, due to heat transfer through the sides of the chuck and due to a cooling jacket at the sides of the chuck. The area of the projections is made larger in the central portion of the wafer to provide more heat transfer at the center of the wafer. Smaller area projections are used in the periphery of the wafer. This patent relies on the direct conduction of heat through the projections themselves.

An alternate approach to heat transfer in an electrostatic chuck or other substrate support uses helium gas or another gas applied to the substrate support surface beneath the wafer. Ceramic dielectrics necessary for the electrostatic force on the top of an electrostatic chuck are not particularly efficient for heat transfer, both because of the limited heat transfer characteristics of ceramic material itself, and the inability to polish it sufficiently smoothly, thus leaving interstices at a microscopic level which preclude uniform contact. These interstices, however, can be advantageous. If a helium gas is applied through small holes in the interior of the substrate support, the helium gas can fill the space between the substrate and the wafer, to act as the heat transfer mechanism. One problem with such use of helium gas is preventing it from leaking from the periphery of the substrate support into the chamber itself.

One solution is presented in U.S. Pat. No. 5,096,536, which describes a gas source at the center of the wafer, in an area defined by a first O-ring. A vacuum pump is applied to a second ring area defined by the region between the first O-ring and a second O-ring. This removes most gas leaking through the first O-ring seal.

In Japanese Published Application No. 63-78975, a pair of concentric grooves provide the helium to the backside of the wafer through holes in the grooves. Here, a central vacuum is used to draw off the helium, thus resulting in a lower gas pressure near the vacuum draw off in the central part and a higher gas pressure at the peripheral part, thus varying the cooling efficiency. European Application No. 0,452,222, discussed above, also provides a grid of grooves for providing helium to the bottom side of the wafer.

In some processes, such as PECVD processes, the substrate support is designed so that the substrate edges extend slightly beyond the sides of the substrate support to protect the sides of the substrate support from the chemical reactions or prevent deposition of material on the support. A disadvantage of the overhanging edges of the substrate is that they tend to get hotter, since they do not have contact with the substrate support to effect heat transfer. Additionally, heat from the reaction gets applied to both the top and bottom sides of the substrate on the overhanging portions. This can cause problems in the uniformity of chemical reactions on the wafer. If different parts of the wafer are at different temperatures, structures on the wafer intended to be identical may be formed at different rates, thus producing inconsistent results. Accordingly, it is desirable to have a uniform temperature across the wafer by providing varying heat transfer by a mechanism that can operate in a plasma environment.

SUMMARY OF THE INVENTION

The present invention provides an improved substrate support and method for operating in which multiple pressure zones are provided on the surface of the substrate support. A seal area is provided between the different zones to allow different gas pressures in the different zones. A higher gas pressure is provided to a zone corresponding to an area of the substrate where greater heat transfer is desired. The gap between the substrate support and the wafer, and the gas pressure are each selected to provide the desired amount of heat transfer.

In one embodiment, a feedback control loop is used to control the pressure in the different zones, and thus, control the temperature of the substrate. At least one temperature sensor is used to provide a temperature signal, with a controller responding to that signal to control the gas pressure to adjust the heating or cooling accordingly.

In one embodiment, a number of protrusions extend from the top of the substrate support to provide spaces which facilitate the gas flow of the heat transferring gas beneath the substrate. The heat transfer thus becomes substantially independent of the surface roughness of the substrate and substrate support. Preferably, the protrusions are evenly spaced throughout the top surface of the electrostatic chuck, and the non-contact area of the spaces between the protrusions is larger than the contact area of the protrusions.

The height of the protrusions, that is, the gap between the substrate and the top of the substrate support, is optimized. First, the gap is chosen to be small enough to ensure free molecular heat transfer and prevent gas breakdown due to electric fields. In addition, the gap size must be small compared to the overall dielectric thickness to avoid anomalies forming on the substrate at the protrusion contact points. These contact points have substantially different dielectric values compared to the gaps, causing point differences in the electric field. Second, the gap must be large enough to allow the gas pressure distribution to reach steady state quickly, so the process start-up time is not affected. Preferably, the height is less than the mean or average free path of the transferring gas(es). The size of the protrusions is sufficient to support the substrate without excessive bowing, while maximizing the space for the gas.

In another embodiment for an electrostatic chuck, the thickness of the dielectric is varied. In particular, the dielectric is made thicker in the middle of the support so that there is a greater electrostatic force around the periphery of the wafer. This improves the heat transfer at the periphery of the wafer both by virtue of preventing the edges from bowing due to a heat differential at the edges, and by, in one embodiment, enabling high pressure heat-transferring gas at the periphery of the wafer to be contained without escaping.

For a further understanding of the nature and advantages of the invention, reference should be made to the following description taken in conjunction with the accompanying drawings.

DETAILED DESCRIPTION OF THE PREFERRED EMBODIMENTS

Figure 1:
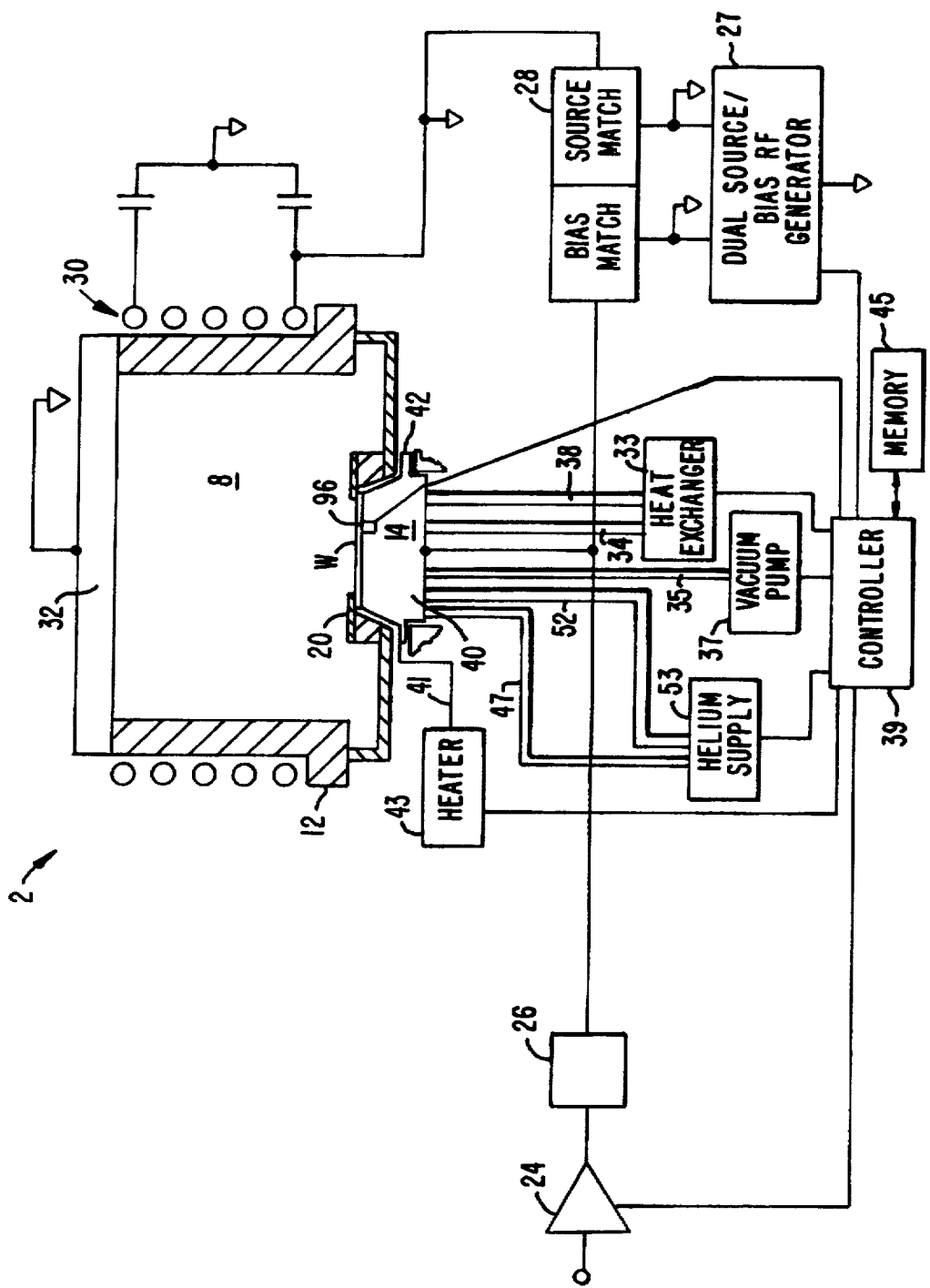
FIG. 1 is a diagram of one embodiment of a semiconductor processing system using the present invention.

FIG. 1 shows a representative wafer processing apparatus 2 incorporating an electrostatic chuck 14 according to the principles of the present invention. Substrate supports other than chuck 14 could be used, with the electrostatic chuck being used as an illustrative example. Electrostatic chuck 14 supports, and electrostatically holds, a semiconductor wafer W within a high density plasma reaction chamber 8 of the apparatus 2.

Referring to FIG. 1, wafer processing apparatus 2 is attached to a mainframe unit (not shown) which provides electrical, gas, wafer handling and other support functions for the chamber. Apparatus 2 usually will be removably attached to the mainframe unit, e.g. with bolts, so that the plasma reaction chamber 8 can be removed for maintenance or repair or can be replaced with another chamber. Mainframe units that are compatible with the illustrative embodiment of wafer processing apparatus 2 are currently commercially available as the Precision 5000™, Centura 5200™ and the Endura 5500™ systems from Applied Materials, Inc. of Santa Clara. It should be understood, however, that although the invention is shown and described as part of a plasma reaction chamber in a multi-chamber processing system, it is not intended to be limited in this manner. That is, the invention can be used in a variety of processing chambers.

Wafer processing apparatus 2 includes an enclosure assembly 12 housing the plasma reaction chamber 8 and electrostatic chuck 14. Enclosure assembly 12 includes a cover ring 20 or hot process kit supported over electrostatic chuck 14, preferably by four rods (not shown). Cover ring 20 comprises a dielectric material that serves to prevent or minimize plasma in chamber 8 above the wafer W from contacting, and thereby corroding, part of the electrostatic chuck 14.

The system employing the electrostatic chuck 14 includes conventional electrical circuitry for the plasma reaction chamber 8. The electrical circuitry includes a DC power supply 24 and an RF power supply 27. DC power supply 24 supplies a suitable clamping voltage, e.g., +700 or −1200 volts, between the electrostatic chuck 14 and the chamber walls (which are grounded). Power supply 24 is coupled to electrostatic chuck 14 through a low pass filter 26 which isolates the DC power supply 24 from the RF power supply 27.

The RF power supply provides the plasma reaction power. RF source power and RF bias power are each coupled to the chamber through an impedance matching network 28, with the source power being coupled to an inductive antenna 30 and the bias power being coupled to electrostatic chuck 14. The source RF generator produces the ions in the plasma necessary for the chemical reaction desired. The bias RF drives those ions toward the wafer substrate. A ground reference for both the RF bias power and DC voltage is a grounded top electrode 32. The DC power supply 24 supplies the clamping voltage for developing an electric field to electrostatically hold the wafer W to the pedestal. When it is desired to release (or "de-chuck") the wafer W, source 24 may be switched either to a zero output voltage or to a reverse polarity voltage if it is desired to accelerate the release of the wafer.

The plasma reaction chamber employs inductive-coupled RF power to generate and maintain a high density, low energy plasma. RF bias power is capacitively coupled to the plasma via the wafer W and electrostatic chuck 14, with the grounded counter electrode 32 located in the plasma source region providing a return path for bias current. A more detailed description of the illustrative plasma reaction chamber 8 and its operation in processing wafer W can be found in commonly assigned U.S. Pat. No. 5,350,479, to Collins et al.

Electrostatic chuck 14 includes inlet water pipe 34 and outlet water pipe 38, both of which are connected to a heat exchanger 33. Helium gas inlets 47 and 52 are connected to a helium supply 53 for providing helium to the surface of the electrostatic chuck beneath the wafer. An optional vacuum line 35 is connected to a vacuum pump 37 for evacuating the helium from the electrostatic chuck surface. In addition to the water pipes, the electrostatic chuck optionally may have a heating line 41 connected to a heater 43 for resistively heating the electrostatic chuck to heat the wafer.

Heat exchanger 33, vacuum pump 37, helium supply 53 and heater 43 are all controlled by a controller 39 operating with a program stored in a memory 45. Controller 39 also controls the DC power supply 24 and the RF power supply 27, as well as other aspects of the wafer processing system not shown in FIG. 1. Also shown is a temperature sensor 96 which is connected to controller 39 for providing feedback on the temperature of the wafer.

Figure 2A:
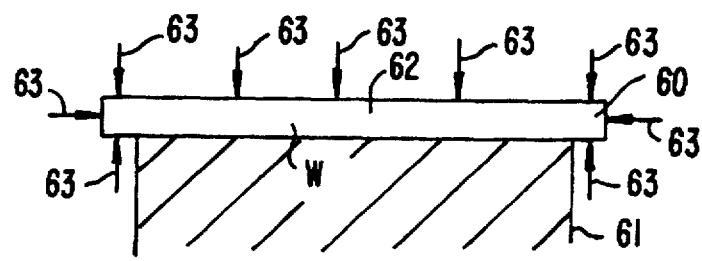
FIGS. 2A–2C are diagrams illustrating the temperature gradients on a wafer due to non-uniform heating.
Figure 2B:

FIGS. 2A and 2B illustrate uneven heating of a wafer. FIG. 2A shows a wafer W with a peripheral portion 60 overhanging a pedestal substrate support 61. Typically, such an overhang is provided to avoid having fluorine, sputtering, or other aspects of wafer processing etch away the alumina coating on the side and top of the substrate support. Arrows 63 illustrate heat from a plasma or chemical reaction being transferred to the wafer. As shown, a central portion 62 of the wafer only receives heat from the top, while periphery portion 60 receives heat from the top, side and bottom. In addition, the pedestal is directly below the central portion 62 and can remove heat, while heat from the peripheral portion is not easily directly removed.

Figure 2C:
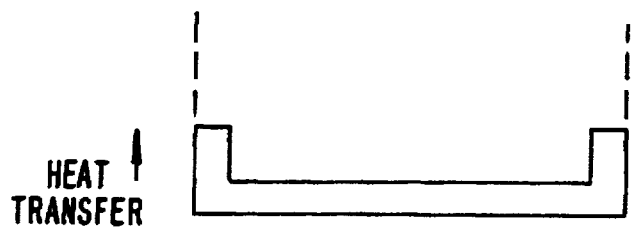

A typical temperature distribution on wafer W is shown in FIG. 2B. As shown, the wafer is much hotter at the peripheral portions. FIG. 2C shows the ideal heat transfer profile of the substrate, which the present invention strives to achieve. As shown, a significantly greater amount of heat transfer is desired in a narrow area near the periphery. Ideally, the location of heat removal closely matches the location of heat input to avoid lateral heat transfer.

Figure 3:
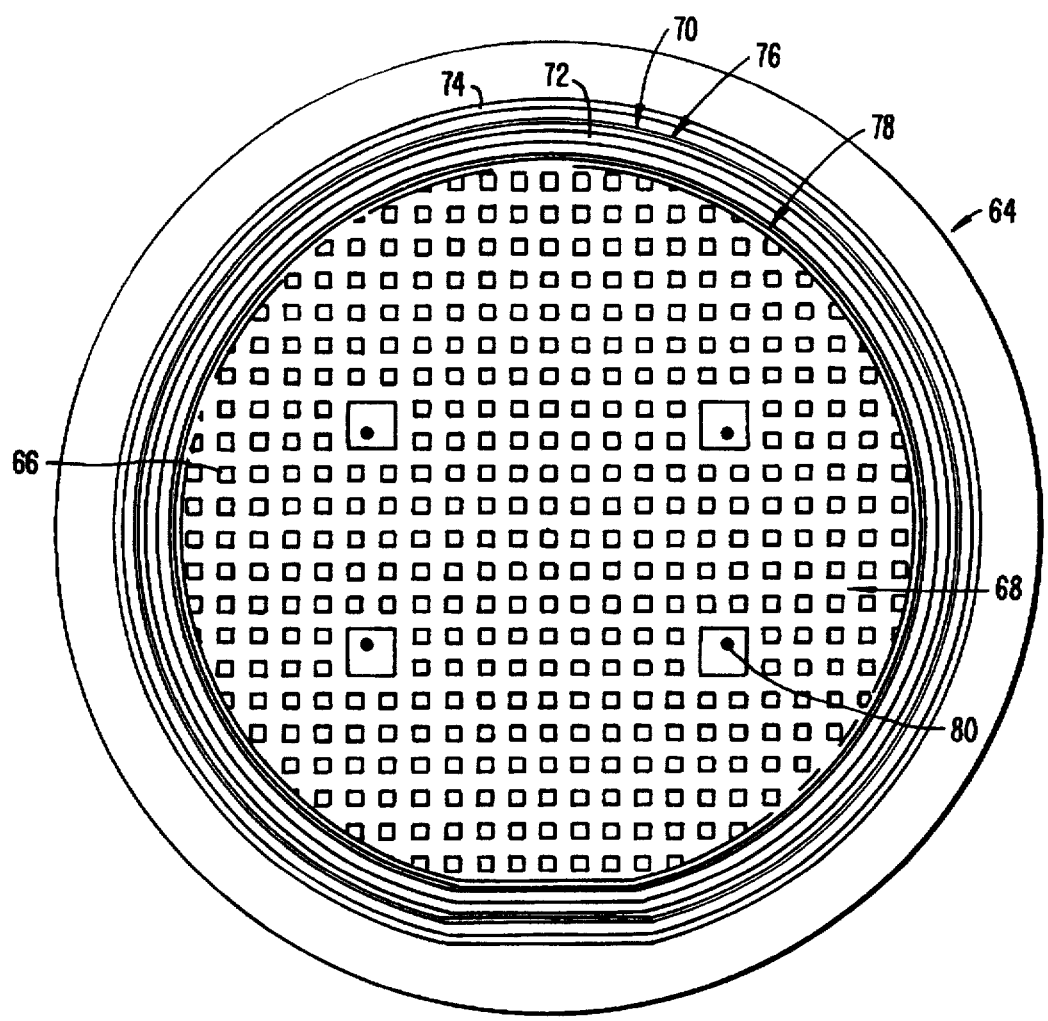
FIG. 3 is a top view of the pressure zones and minimum contact protrusions according to one embodiment of the present invention.

FIG. 3 is a top view of one embodiment of an electrostatic chuck 64 according to the present invention. Instead of having a smooth top surface, a number of grooves are provided in the surface to form a large number of protrusions 66. A central zone 68 of these protrusions is separated from a peripheral zone 70 by a seal 72. Seal 72 is simply an area which has not had grooves formed in it to provide protrusions, thus forming a solid surface to provide essentially uniform contact with the wafer. An outer seal 74 provides a barrier to minimize leakage of helium gas into the chamber.

Helium gas is inserted into periphery zone 70 through a ring 76 which is a groove having a series of holes in it which receive high-pressure helium into this zone from high-pressure helium line 47 of FIG. 1. An inner ring 78 allows a lower pressure gas to the central zone 68 from low-pressure helium line 47. In operation, after establishing an initial low helium pressure in central zone 68, helium ring 78 typically will be removing helium gas leaking through seal area 72 to maintain the desired low pressure helium. In this fashion, the seal area functions as a baffle so as to bifurcate helium gas inserted into periphery zone 70 so that a portion of the same flows over seal area 72 and into helium ring 78. This creates spaced-apart pressure differentials in the helium gas, i.e., a high-pressure in ring 76 and a low-pressure in central zone 68. The high-pressure helium gas allows a greater amount of thermal transfer than the low-pressure helium gas; thus, a heat transfer gradient is defined in which a greater amount of heat is transferred from a portion of a wafer disposed adjacent to the periphery zone 70 than is transferred between a portion of a wafer disposed adjacent to the central zone 68. In an optional embodiment, vacuum holes 80, which may be lift pin holes, can be used to pump out the gas in the central zone using vacuum line 35 of FIG. 1 to further lower the pressure in the central zone. Optionally, additional vacuum holes could be added.

Helium groove 78 is preferably positioned near seal area 72. By positioning it as close as possible, the desired heat transfer step function of FIG. 2C can be approached. The high pressure gas is thus contained in a narrow region by the periphery. If the high pressure gas extended too far toward the center of the wafer, the cooler center would become even cooler, partially offsetting the reduction in heat differential provided by the high pressure gas. Thus, the aforementioned heat transfer gradient is a function of a magnitude of a separation of the spaced-apart pressure differential.

In operation, for heating the wafer, low-pressure helium (1–15 torr) is provided into the central zone 68, and high-pressure helium (1–20 torr) is provided to peripheral zone 70. The higher pressure helium in the peripheral zone provides better heat transfer at the periphery of the wafer to offset the heating effect noted in FIG. 2.

In one embodiment, the seals are made of the same ceramic coating as the remainder of the top of electrostatic chuck 64. Such a ceramic coating has small interstices, and thus the seal areas do not provide a perfect seal. In addition, the substrate or wafer will have some backside roughness, and may have more roughness than the substrate support. Accordingly, the seal area should have sufficient width to prevent significant leakage of helium from one area to the other. It has been determined by testing that for a ceramic covered electrostatic chuck with the pressure ranges set forth above, that a seal width of $1/10$ inch, or 100 mils, is effective. Preferably, the seal width is in the range of 50 to 300 mils. For the outer seal 74, it is desirable to minimize the width because the area of the wafer above this seal will not have the benefit of the heat conduction from the high-pressure helium. At the same time, the seal must be wide enough to prevent significant leakage of helium into the chamber which could affect the reaction in the chamber. The same 100 mil width has been found effective, with an optimum seal width being in the range of 50 to 300 mils. Alternate widths may be appropriate for different materials and smoothness of the substrate support and substrate. For example, if a polymer film, such as Kapton™, available from many well-known suppliers, is used, a small width can be achieved because of its compliancy.

A preferred heat transfer gas is helium because it is inert and relatively inexpensive. Alternately, argon, oxygen, $CF_4$, or other gases could be used, or a mixture of gases may be used. A mixture could be used, for instance, to give additional pressure control capabilities. The particular gas could be chosen to be compatible with the chemical process in the chamber so that any leaking gas will have minimal effect on the chemical reactions. For example, in an etching reaction using fluorine as an etching species, it may be desirable to use $CF_4$ as the backside heat transfer gas.

Because heat conduction occurs primarily through the helium gas, it is desirable to minimize the size and number of the protrusions and seal areas for this purpose. Thus, there should be less contact area than non-contact area over the area of the substrate. On the other hand, the seals are required to prevent gas leakage and the protrusions must be of sufficient size and spacing to mechanically support the wafer. In addition there are other factors to be optimized. The height of the protrusions, which determine the gap between the substrate and the substrate support between the protrusions, must be sufficient to allow the gas to quickly become distributed throughout the zones without affecting a process start up time. Typically, this must be on the order of a few seconds, and preferably the gas is distributed in 10 seconds or less.

For optimum heat transfer, the gap should be small enough so that heat transfer primarily occurs by molecules travelling directly from the substrate to the substrate support without colliding with another gas molecule, giving free molecular heat transfer. Thus, the gap should be less than the mean free path of the gas (or the average free path if a mixture of gases is used). The mean free path is a function of the pressure of the gas and the molecular collisional cross-section. Where a variety of pressures will be used, the mean free path will vary. In a preferred embodiment, the mean free path of the maximum pressure to be applied is used to determine the gap dimension.

In addition, the ratio of the gap to the overall dielectric thickness must be kept small to avoid local anomalies on the substrate. If this ratio is significant, the equivalent capacitance will vary significantly between the spaces and the protrusions, applying a significantly different electric field to the substrate. This different field can affect the chemical process, causing non-uniformities in the film that is being deposited, etched, doped, or undergoing other property transformations. Some difference will necessarily be present, but it is desirable to minimize this. The significance of the ratio also varies depending on the dielectric material, in particular the difference between the dielectric constant of the material and the heat transfer gas (essentially one). The closer the two dielectric constants, the less the concern with a larger gap.

Another concern in setting the gap size is to avoid having a plasma generated with the heat transfer gas between the substrate support and the backside of the wafer. It is believed that this would begin to be a concern if the gap size were several times the mean free path of the heat transfer gas.

For one embodiment of an electrostatic chuck, the thickness of the ceramic coating is on the order of 7–10 mils. If Kapton™ is used, a thickness of 1–2 mils may be used. Ideally, for chucking purposes, the dielectric is as thin as possible within the limits of maintaining manufacturing consistency and avoiding dielectric breakdown. The mean free path of helium at the pressures for the two zones described above is about 1–5 mils (at very high pressures, the mean free path may be less than one). Accordingly, protrusion heights of 0.7–1.2 mils have been chosen, tested, and found effective. This gives a gap less than the mean free path of helium at the desired pressures. Preferably, the gap is less than twice the mean free path of the heat transfer gas at the pertinent pressures, and more preferably less than the mean free path.

The spacing between the protrusions is as large as possible while still supporting the substrate without bowing. In one embodiment, the substrate is kept planar, while in other embodiments it may be desirable to vary the protrusion height, or alternately the top surface of the substrate support (with the protrusions of equal height), to properly support a curved substrate. Another factor is avoiding sharp points that could cause local anomalies in the electric field. Too large a spacing can also affect the movement of charge during dechucking, causing damage.

It has been determined that an optimum center-to-center spacing of the protrusions is in the range of 100–300 mils, more preferably approximately 300 mils. The size of the protrusions themselves is preferably between 10 and 150 mils, more preferably approximately 130 mils in diameter. Square protrusions are shown simply because of their ease in manufacture, and other shapes could be used as well. Annular shapes could be used, for example.

In the embodiment shown, no openings for removing gas are shown in the outer peripheral region, although this can be provided in an alternative embodiment. The control of helium pressure can be done either by providing high or low pressure helium, or by more pumping through a vacuum pump. Similarly, for the central region, the pressure can be controlled in either of these ways or through a combination of both. The placement of the helium source as a ring near the edges in combination with a vacuum near the middle of the support provides an additional pressure gradient within the central region, decreasing towards the center. An alternate embodiment of the present invention thus provides a coarse adjustment of the heat transfer through the two pressure zones, with a fine tuning occurring through the placement of the helium inlet and vacuum outlets in the central portion. In alternate embodiments, more than one zone could be used for finer adjustments, with the trade off of requiring more hardware.

Figure 4:
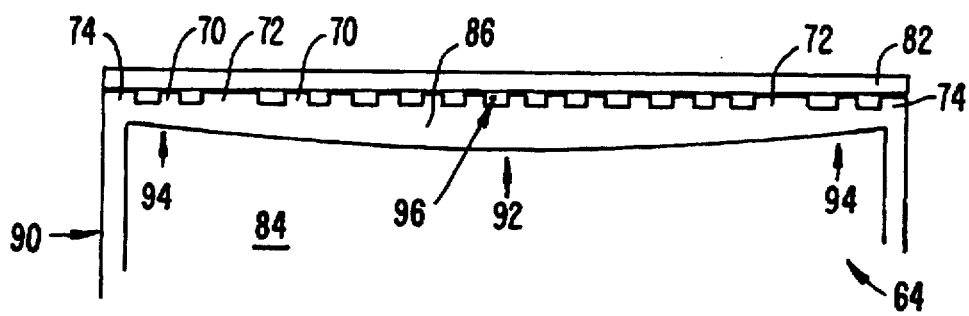
FIG. 4 is a side view showing the varying dielectric thickness according to one embodiment of the present invention.

FIG. 4 is a side view of one embodiment of an electrostatic chuck 64 showing a varying dielectric thickness of a dielectric 86. A wafer 82 is shown mounted on the chuck. The chuck includes an electrode portion 84 covered by dielectric 86. The dielectric extends across the top and along the sides 90 of the electrostatic chuck. As can be seen, the dielectric is thicker at a central portion 92, and thinner at peripheral portions 94. The side view shows the multiple protrusions 70 and also shows the inner seal 72 and the outer seal 74.

The thinner dielectric at peripheral portions 94 provides a stronger electrostatic force at these portions. This is beneficial for a number of reasons. First, it holds the wafer more tightly, ensuring better heat transfer by providing better contact with the top of the electrostatic chuck. Second, a tighter force helps hold in the higher pressure helium between seals 72 and 74 near the periphery. In addition, if the peripheral portion of the wafer has a temperature different from the central portion, this may cause it to bend relative to the central portion, and it may bow up or down, further exacerbating the heat differential problem. This can be overcome by an appropriately higher electrostatic force at the peripheral portion.

In an alternate embodiment, the varying dielectric thickness can be used without the two pressure zones, or without the protrusions. The varying in the dielectric coating can be continuous, or stepwise. A stepwise difference makes the manufacturing simpler and less expensive.

Another advantage of the seal area 74 and the stronger electrostatic force at the edge of the wafer is to prevent arcing of the plasma to exposed metal near the top surface of the electrostatic chuck. Such exposed metal would typically be at the helium inlet ports, which would come up through the aluminum electrode, thus exposing through those holes a path to the electrode. Arcing is prevented by providing a tighter seal, locating the helium inlet holes sufficiently away from the edges of the electrostatic chuck, or putting a groove there to prevent such arcing.

As shown in FIG. 4, a temperature sensor 96 can be placed in the space between the top surface of the electrostatic chuck and the wafer. The temperature of the wafer can thus be inferred from the sensor.

Figure 5:
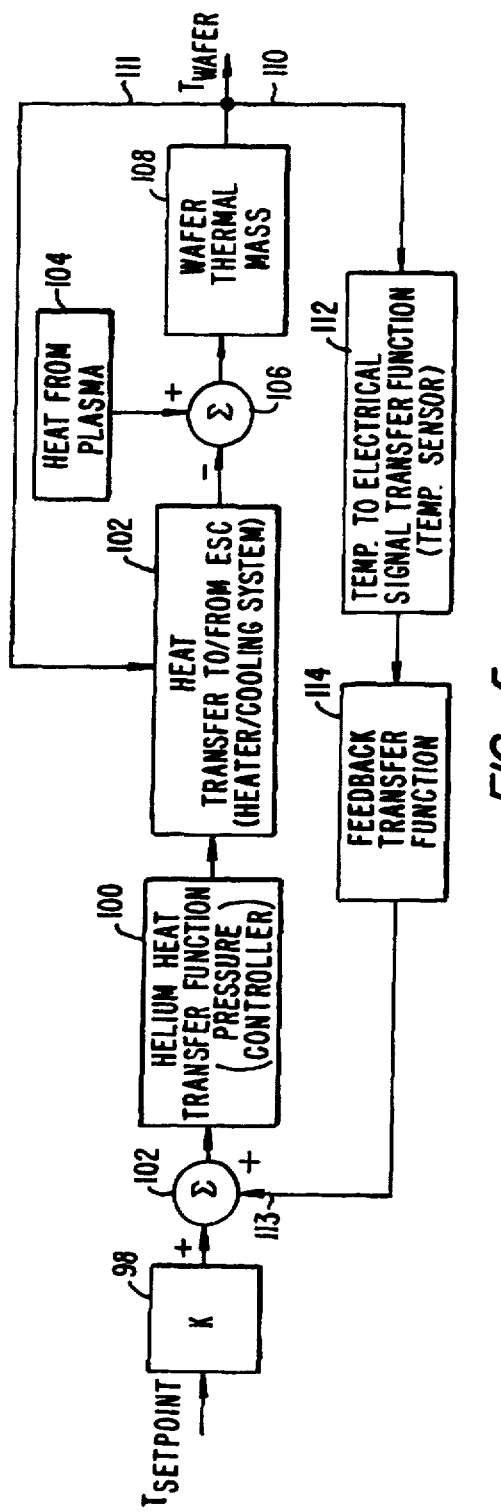
FIG. 5 is a block diagram of the electronic control loop for controlling the wafer temperature according to another embodiment of the present invention.

FIG. 5 is a feedback control system signal flow diagram illustrating the temperature control. The FIG. 5 diagram is for a closed loop temperature control system for controlling the helium pressure. Alternately, an open loop system could be used without the temperature sensor. Prior experimentation could dictate the appropriate helium pressure for the desired process parameters, and thus the temperature sensor could be eliminated in an alternate embodiment. FIG. 5 contains both functions performed in a processor, and physical effects.

As shown in FIG. 5, a temperature setpoint is provided as a user-programmed input to controller 39 of FIG. 1 from a control program in a memory 45. The temperature setpoint value is multiplied by a constant 98 by the controller, which adds the result to a feedback signal 113 as indicated by an add function 102. The result of the add function is used by the controller to control the helium pressure by controlling flow restrictors or valves in the helium supply. This varies the extent of the heat transfer of the helium gas. In a preferred embodiment, the helium pressure is controlled according to a mathematical model; however, empirical results could also be used as the basis of the pressure control. The mathematical model is described below. The helium pressure controls the heat transfer to the electrostatic chuck (ESC) as indicated by block 102 (alternately, any type of substrate support may be used). The ESC is either cooled by heat exchanger 33, or heated by heater 43, with the amount of heat transfer to the wafer controlled by the helium pressure. This heat transfer can be offset by the heat generated by energy transferred from the plasma (as illustrated by block 104), which combines (as illustrated by block 106) with the heat transfer to the ESC. The total heat transfer, applied to the wafer thermal mass (as illustrated by block 108), produces the temperature 110 of the wafer. Note that alternate substrates may be used rather than a semiconductor wafer. The final temperature 110 of the wafer also impacts the amount of heat transfer to the electrostatic chuck, as indicated by feedback line 111. The heat transfer function between the ESC and the wafer indicated in block 102 is a function of the temperature of the wafer, as well as the temperature of the ESC. As shown, the heat transfer to the ESC (102) removes heat from the wafer while the heat from the plasma (104) adds heat to the wafer. However, these can be reversed when the electrostatic chuck is used to heat the wafer, and thus provides heat input while heat is removed due to the plasma at a lower temperature, or simply by the chamber in the absence of a plasma.

A block 112 illustrates the transformation of the temperature into an electrical signal by the temperature sensor. Block 114 illustrates the transfer function applied in the processor before combining the temperature signal with the temperature setpoint as a feedback. Such a transfer function could in its simplest form be a multiplication by a constant, which could be unity, or simply a transformation from an analog signal to a digital signal.

The functions performed by the controller are done under the control of a program in memory 45. That program will include instructions for performing the various steps, such as instructions for reading the temperature indication from the temperature sensor, an instruction for comparing that temperature to the desired input set temperature, and an instruction for controlling the pressure valve (or flow restrictor) to vary the pressure of the gas in a particular pressure zone. Other instructions are provided to shut off the gas in the event of a fault, etc.

The helium pressure can be controlled by increasing or decreasing the pressure where a simple one pressure electrostatic chuck is used. Alternately, where two pressure zones are used as in the preferred embodiment of the invention, the outer and inner helium pressures can be controlled separately. The temperature of each region can be inferred from a single temperature sensor which may be placed, for instance, near the intersection of the two zones. Alternately, two different temperature sensors could be used. In other alternate embodiments, the temperature sensor could be attached to the top surface of the electrostatic chuck, or alternately be put in direct contact with the wafer itself. The temperature sensor may be used to infer the pressure, such as where there is leakage between zones causing a pressure variance. A pressure regulator may detect only the pressure at its output, which would typically be some distance from the wafer, which could thus have a different pressure under it. A temperature sensor could be used to infer the actual pressure under the wafer. Depending on the wafer surface roughness, the leakage could vary, and the pressure provided may need to be varied.

The control system typically will have certain constraints on it. For instance, the helium pressure is limited so that the wafer is not lifted off the electrostatic chuck, or so much of a pressure differential is provided to cause a thermal gradient that damages the wafer due to thermal stress. In the event that such constraints are exceeded, or some other defined fault occurs, the gas flow is stopped.

Figure 6:
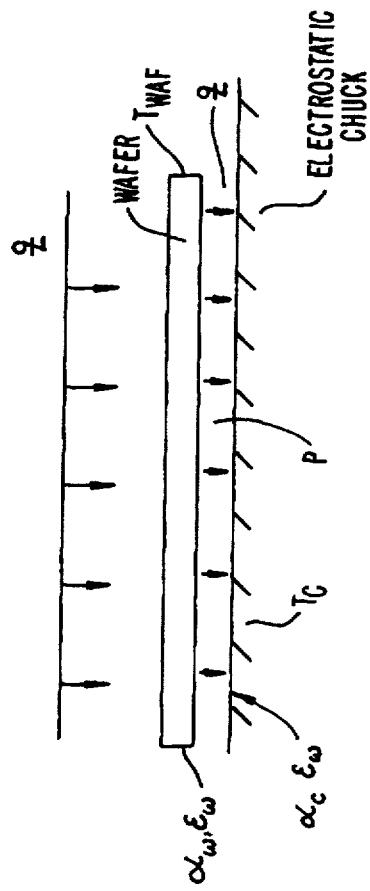
FIG. 6 is a diagram illustrating a mathematical model for the gas pressure control system.

As mentioned above, in a preferred embodiment of the system of this invention a mathematical model of a heat transfer function is used to control the helium pressure. This model is described in conjunction with FIG. 6. As shown in FIG. 6, a wafer is positioned on an electrostatic chuck. To illustrate the model, an enlarged space is shown between the chuck and the wafer.

For the system shown in FIG. 6, consider:

| | |
|---|---|
| $q_P$ | the heat flux from the plasma |
| $q_{OUT}$ | the heat flux to the substrate (chuck) |
| $q_{RAD}$ | the heat flux due to thermal radiation |
| $q_{GAS}$ | the heat flux due to free molecular thermal conduction |
| $T_{WAF}$ | the wafer temperature (sensor temperature) |
| $T_C$ | the temperature of the electrostatic chuck |
| $\alpha_W$ | the accommodation coefficient of the wafer |
| $\epsilon_W$ | the emissivity of the wafer |
| $\alpha_C$ | the accommodation coefficient of the chuck |
| $\epsilon_C$ | the emissivity of the chuck |
| $\sigma$ | Stephan Boltzman constant |
| p | gas pressure |
| $\gamma$ | the correction factor due to local boundary conditions, e.g., sensor position, wafer position, etc. |
| $\rho$ | wafer density |
| $c_P$ | the specific heat for the wafer |
| t | the wafer thickness |
| $\Lambda$ | the thermal conductivity of the gas |

For the wafer, using conservation of energy $$\rho t c_P \frac{dT_W}{dt} = q_{IN} - q_{OUT} \quad (1)$$

$$q_{IN} = q_P \gamma \quad (2)$$

$$q_{OUT} = q_{RAD} + q_{GAS} \quad (3)$$

$$q_{RAD} = \epsilon_W \sigma T_W^4 - \epsilon_C \sigma T_C^4 \quad (4)$$

$$q_{GAS} = \frac{\alpha_C \alpha_W}{\alpha_W + \alpha_C - \alpha_W \alpha_C} \Lambda p(T_W - T_C) \quad (5)$$

Let $$\beta = \frac{\alpha_C \alpha_W}{\alpha_W + \alpha_C - \alpha_W \alpha_C}, \quad (6)$$

accommodation factor $$\rho t c_P \frac{dT_W}{dt} = \gamma q_P - [\{\epsilon_W \sigma T_W^4 - \epsilon_C \sigma T_C^4\} + \beta \Lambda p(T_W - T_C)] \quad (7)$$

at steady state $$\frac{dt_W}{dt} \to 0 \quad (8)$$

$$0 = \gamma q_P - \{[\epsilon_W \sigma T_W^4 - \epsilon_C \sigma T_C^4] + \beta \Lambda p(T_W - T_C)\} \quad (9)$$

Simplify to:

$$p = \frac{\gamma q_P + \sigma[\epsilon_C T_C^4 - \epsilon_W T_W^4]}{\beta \Lambda (T_W - T_C)} \quad (10)$$

Figure 7:
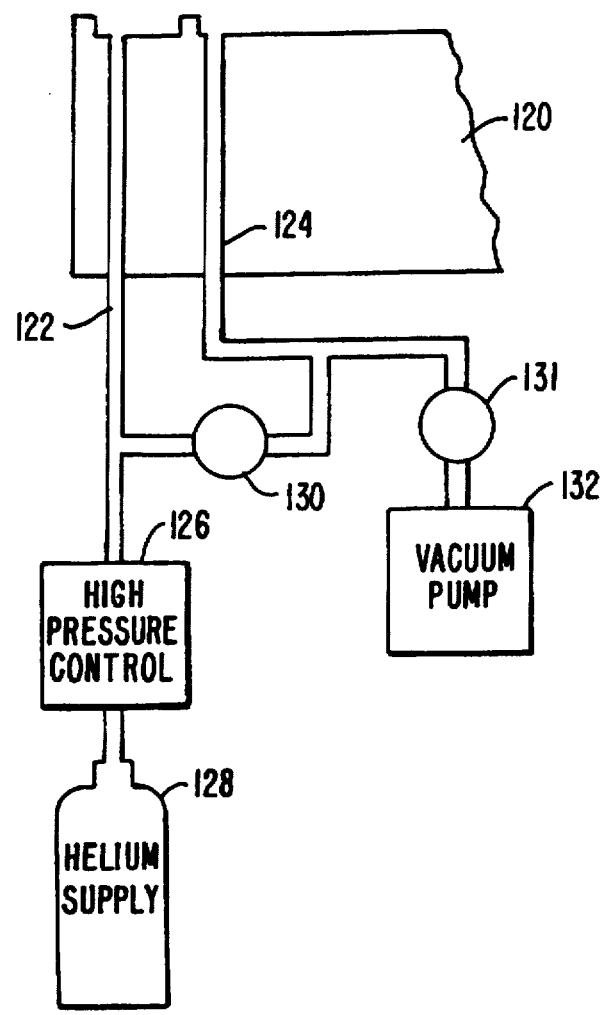
FIG. 7 is a diagram of one embodiment of a gas pressure control system according to the invention.

One embodiment of a pressure control system for two pressure zones is shown in FIG. 7. A substrate support 120 has a high pressure gas line 122 and a low pressure gas line 124 connected to separate zones. A high pressure helium controller 126 feeds high pressure line 122 from a pressurized helium tank 128. Controller 126 monitors the pressure at its output, and controls the flow of helium to maintain the desired pressure. A valve 130 provides a pressure drop between high pressure line 122 and low pressure line 124. In this way, a single pressure controller can be used to control both pressures. A vacuum pump 132 is also connected to low pressure line 124 to provide another level of control through a valve 131. Alternately, two separate controllers could be used, or the vacuum pump could be connected to a separate line. Alternately, flow restrictors could be used instead of valves. In another embodiment, separate pressure controllers and flow restrictors could be used for the separate pressure zones.

As will be understood by those of skill in the art, the present invention may be embodied in other specific forms without departing from the spirit or essential characteristics thereof. For example, three pressure zones could be used instead of two. Alternately, different combinations of the various features set forth in the invention could be used. For instance, the use of the protrusions could be combined with a varying dielectric without using pressure zones. Alternately, pressure zones could be combined with a varying dielectric without using the protrusions. Similarly, other combinations are possible. Accordingly, the foregoing embodiments are meant to be illustrative, but not limiting, of the scope of the invention which is set forth in the following claims.

What is claimed is:

1. A substrate support for holding a substrate, said support comprising:

a body having a surface and a first passageway in said body and terminating proximate to said surface, said surface having spaced-apart recessed regions for allowing a gas to flow between said support and said substrate, said spaced-apart recessed regions defining first and second zones and a seal disposed therebetween, said second zone surrounding said first zone and in fluid communication with said first passageway allowing said gas to enter said second zone, said first and second zones each having a volume associated therewith, with the volume of said first zone being greater than the volume of said second zone.

2. The substrate support of claim 1 wherein said substrate support is in a processing chamber, and further comprising at least one temperature sensor mounted in said chamber and coupled to a controller for varying the pressure of said gas.

3. The substrate support of claim 2 wherein said temperature sensor is in direct contact with said substrate.

4. The substrate support of claim 2 further comprising:

a memory coupled to said controller, said memory storing coded instructions including:

a first instruction for reading a temperature indication from said temperature sensor;

a second instruction for comparing said temperature indication to a desired temperature corresponding to a desired temperature of said substrate; and a third instruction for varying said pressure of said gas in said first and second zones to vary the heat transfer characteristics of said gas to bring said substrate closer to said desired temperature of said substrate.

5. The substrate support of claim 4 wherein said coded instructions further comprise:

a fourth instruction for shutting off said gas in the event of a fault.

6. The substrate support of claim 1 wherein said substrate has a periphery, with said second zone disposed proximate to said periphery.

7. The substrate support of claim 1 wherein said seal and said second zone each have a width associated therewith, with the width associated with said second zone being greater than the width associated with said seal.

8. The substrate support of claim 1 further comprising a second passageway in said body and terminating in an opening disposed in said first zone.

9. The substrate support of claim 1 wherein said seal has an annular shape and is a continuous portion of said surface.

10. The substrate support of claim 1 wherein said body includes an annular opening positioned in said first zone adjacent to said seal, and a second passageway extending between said annular opening in said second zone and one of said opposed major surfaces.

11. The substrate support of claim 10 further comprising:
a supply containing said gas;
a high pressure line connected between said supply and said second zone;
a high pressure controller connected to said high pressure line;
a low pressure line connected between said supply and said first zone; and
a flow restriction device connected between said high pressure line and said low pressure line.

12. The substrate support of claim 11 wherein said supply of gas is helium.

13. The substrate support of claim 1 wherein said seal has an annular shape, defining an annular seal and further comprising a peripheral seal surrounding said annular seal.

14. The substrate support of claim 13 wherein said peripheral seal has a width of less than 300 mils.

15. The substrate support of claim 1 wherein said substrate support is an electrostatic chuck.

16. The substrate support of claim 1 wherein said substrate is a semiconductor wafer.

17. The substrate support of claim 1 further comprising:
a gas source coupled to said first passageway; and
a gas controller for controlling a flow of said gas, said gas controller having a control input coupled to said controller.

18. The substrate support of claim 17 further comprising:
at least one low pressure passageway coupled to said second zone;
a vacuum pump; and
a flow restriction device connected between said vacuum pump and said low pressure passageway having a control input coupled to said controller, said control valve at least partially controlling the pressure in said second zone.

19. The substrate support of claim 1 further comprising:
a plurality of spaced-apart protrusions disposed in said first zone with spaces between protrusions having a greater area than said protrusions.

20. The substrate support of claim 19 wherein a height and spacing of said protrusions are dimensioned to provide free molecular heat transfer between said substrate and said substrate support for at least one gas pressure.

21. The substrate support of claim 19 wherein a height and spacing of said protrusions are dimensioned to allow said gas to fill said zones in less than 10 seconds for at least one gas pressure.

22. The substrate support of claim 19 wherein said substrate support is an electrostatic chuck, and a height and spacing of said protrusions are dimensioned to avoid gas breakdown due to an applied electrical field.

23. The substrate support of claim 19 wherein said spaces define a plurality of gaps between said support and said substrate, each of which is less than 200 percent of the mean free path of said gas for a given pressure.

24. The substrate support of claim 19 wherein said spaces define a plurality of gaps between said support and said substrate, each of which is less than a mean free path of said gas for at least one pressure applied to said top surface.

25. The substrate support of claim 19 wherein a center-to-center spacing of a subset of said plurality of protrusions is between 200 and 400 mils.

26. The substrate support of claim 1 wherein said substrate support is an electrostatic chuck with dielectric material disposed on said surface with said dielectric material being thinner in said peripheral portion of said chuck than in a central portion of said chuck to provide a stronger electrostatic attraction force at a periphery of said chuck to provide greater heat transfer from said substrate near said periphery of said chuck.

27. The substrate support of claim 26 further comprising:
an electrode disposed beneath said dielectric material;
a power supply for applying a voltage to said dielectric material;
wherein an amount of said voltage and the thinness of said dielectric material at said periphery portion is sufficient to hold said wafer against said electrostatic chuck so that a minimal amount of high pressure helium escapes from said periphery portion into said chamber.

28. A substrate support for holding a substrate having a periphery, said substrate support comprising:
a body having a surface and a first passageway in said body and terminating proximate to said surface, said surface having spaced-apart recessed regions for allowing a gas to flow between said support and said substrate, said spaced-apart recessed regions defining first and second zones and a seal disposed therebetween, said second zone being disposed proximate to said periphery and surrounding said first zone, with said second zone being in fluid communication with said first passageway allowing said gas to enter therein, with said seal and said second zone each have a width associated therewith, with the width associated with said second zone being greater than the width associated with said seal.

29. The substrate support of claim 28 wherein said surface is covered with a dielectric material.

30. The substrate support of claim 29 wherein said surface defines an outer seal surrounding said first zone.

31. The substrate support of claim 30 wherein said first zone surrounds a central portion of said substrate support, with said dialectic material disposed in a region coextensive with each of said inner and outer seals, than in a region coextensive with said central portion, thereby providing stronger electrostatic attraction at a periphery of said chuck.

32. A processing system, comprising:
a substrate processing chamber;
a support, adapted to hold a substrate, mounted in said chamber, said support including a body having opposed major surfaces and a first passageway in said body and terminating proximate to said surface, said surface having spaced-apart recessed regions defining first and second zones and an annular seal area disposed therebetween, with said first passageway being in fluid communication with said second zone;

a supply of gas in fluid communication with said passageway to allow gas to flow between said supply and said second zone, thereby allowing gas to flow between said support and said substrate, with said annular seal area being configured to seat against said substrate and maintain said second zone at a pressure greater than said first zone, with said first zone having a volume, associated therewith, greater than a volume associated with said second zone.

33. The processing system of claim 32 further including a temperature sensor mounted in said substrate support.

34. The processing system of claim 33 wherein said temperature sensor is mounted in a gap between said substrate support and said substrate.

35. The processing system of claim 33 wherein said temperature sensor is in direct contact with said substrate.

36. The processing system of claim 32 further comprising:
 a memory coupled to said controller, said memory storing coded instructions including
  a first instruction for reading a temperature indication from said temperature sensor;
  a second instruction for comparing said temperature indication to a desired temperature corresponding to a desired temperature of said substrate; and
  a third instruction for varying said pressure of said gas to vary the heat transfer characteristics of said gas to bring said substrate closer to said desired temperature of said substrate.

37. The processing system of claim 36 wherein said coded instructions further comprise:

a fourth instruction for shutting off said gas in the event of a fault.

38. A method for effectuating thermal transfer between a support and a substrate disposed thereon, said method comprising the steps of:
 providing a flow of a thermally conductive fluid between said surface and said support; and
 creating differing heat transfer rates between said substrate and said support by bifurcating said flow so as to provide, in said flow, spaced-apart pressure differentials, with a difference between said differing heat transfer rates defining a heat transfer gradient, with said heat transfer gradient being a function of a magnitude of a separation of said spaced-apart pressure differentials.

39. The method as recited in claim 38 wherein the pressure associated with said flow disposed proximate to a periphery of said substrate is greater than the pressure associated with the remaining portions of said flow.

40. The method as recited in claim 38 wherein said heat transfer gradient substantially defines a step function.

41. The method as recited in claim 38 wherein said support includes spaced apart recesses defining a seal therebetween, with said spaced-apart pressure differentials being defined by a portion of said flow disposed therein.

42. The method as recited in claim 41 wherein said spaced-apart recesses define a baffle therebetween, with said heat transfer gradient being a function of a width of said baffle.

43. The method as recited in claim 42 further including the steps of introducing, into one of said spaced-apart recesses, said flow, and moving a portion of said flow across said baffle and into the remaining recess.

* * * * *